(12) United States Patent
Hu et al.

(10) Patent No.: US 12,156,364 B2
(45) Date of Patent: Nov. 26, 2024

(54) QUICK RELEASE MODULE, FAN DEVICE HAVING QUICK RELEASE MODULE AND ELECTRONIC DEVICE HAVING QUICK RELEASE MODULE

(71) Applicant: Wiwynn Corporation, New Taipei (TW)

(72) Inventors: Chao Yen Hu, New Taipei (TW); Chin Luang Huang, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 208 days.

(21) Appl. No.: 18/054,215

(22) Filed: Nov. 10, 2022

(65) Prior Publication Data

US 2024/0072498 A1 Feb. 29, 2024

(30) Foreign Application Priority Data

Aug. 31, 2022 (TW) .................................. 111132840

(51) Int. Cl.
    *H05K 7/14* (2006.01)
    *H01R 13/74* (2006.01)

(52) U.S. Cl.
    CPC ........... *H05K 7/1488* (2013.01); *H01R 13/74* (2013.01)

(58) Field of Classification Search
CPC .... G06F 1/20; H05K 7/20172; H05K 7/1488; H05K 7/20581; H01R 13/74
See application file for complete search history.

(56) References Cited

U.S. PATENT DOCUMENTS 11,849,563 B2 * 12/2023 Zhong ................ H05K 7/20736
2021/0025401 A1 * 1/2021 Shih .................... F04D 25/0693

* cited by examiner

*Primary Examiner* — James Wu
(74) *Attorney, Agent, or Firm* — McClure, Qualey & Rodack, LLP

(57) ABSTRACT

A quick release module includes a support, a first release assembly and a connector. The support has an accommodation hole and a first lateral contact surface located at a periphery of the accommodation hole. The first release assembly includes a first holder. The first holder is slidably disposed on the support, and the first holder is movable towards or away from the first lateral contact surface so as to form an adjustable installation space between the first holder and the first lateral contact surface. The connector is disposed at the adjustable installation space. The connector is fixed by the first lateral contact surface and the first holder, and is removable from the adjustable installation space by sliding the first holder.

25 Claims, 12 Drawing Sheets

QUICK RELEASE MODULE, FAN DEVICE HAVING QUICK RELEASE MODULE AND ELECTRONIC DEVICE HAVING QUICK RELEASE MODULE

CROSS-REFERENCE TO RELATED APPLICATIONS

This non-provisional application claims priority under 35 U.S.C. § 119(a) on Patent Application No(s). 111132840 filed in Taiwan, R.O.C. on Aug. 31, 2022, the entire contents of which are hereby incorporated by reference.

TECHNICAL FIELD

The disclosure relates to a quick release module, a fan device having the quick release module and an electronic device having the quick release module.

BACKGROUND

As the power of a host, such as a server, increases, it is required to increase the current carrying capacity of connectors inside the host. In general, there are two ways to increase the current carrying capacity of a connector, one is to increase pins of the connector to enable more wires to be electrically connected to these pins for evenly sharing the current, while the other is to increase a pitch of pins of the connector to enable the connector to accommodate thicker wires for carrying larger current.

No matter which of the above is used to increase the current carrying capacity of the connector, the size of the connector may be enlarged. However, a fixing mechanism for the connector is merely suitable for single size of the connector, and thus it is required to produce different fixing mechanisms for different sizes of the connector; that is, molds of the different fixing mechanisms are required to be produced, thereby increasing the cost. Therefore, how to solve the aforementioned issue is one of the topics in this field.

SUMMARY

The disclosure provides a quick release module, a fan device having the quick release module and an electronic device having the quick release module which enable different sizes of connectors to be installed thereon.

One embodiment of the disclosure provides a quick release module. The quick release module includes a support, a first release assembly and a connector. The support has an accommodation hole and a first lateral contact surface located at a periphery of the accommodation hole. The first release assembly includes a first holder. The first holder is slidably disposed on the support, and the first holder is movable towards or away from the first lateral contact surface so as to form an adjustable installation space between the first holder and the first lateral contact surface. The connector is disposed at the adjustable installation space. The connector is fixed by the first lateral contact surface and the first holder, and is removable from the adjustable installation space by sliding the first holder.

Another embodiment of the disclosure provides a fan device having quick release module. The fan device includes an outer casing, at least one fan and a quick release module. The fan is disposed in the outer casing. The quick release module includes a support, a first release assembly and a connector. The support is fixed to the outer casing and has an accommodation hole and a first lateral contact surface located at a periphery of the accommodation hole. The first release assembly includes a first holder. The first holder is slidably disposed on the support, and the first holder is movable towards or away from the first lateral contact surface so as to form an adjustable installation space between the first holder and the first lateral contact surface. The connector is disposed at the adjustable installation space. The connector is fixed by the first lateral contact surface and the first holder, and is removable from the adjustable installation space by sliding the first holder, and the connector is electrically connected to the fan.

Still another embodiment of the disclosure provides an electronic device having quick release module. The electronic device includes a main body and a plurality of quick release modules. The quick release modules are disposed on the main body. Each of the quick release modules includes a support, a first release assembly and a connector. The support has an accommodation hole and a first lateral contact surface located at a periphery of the accommodation hole. The first release assembly includes a first holder. The first holder is slidably disposed on the support, and the first holder is movable towards or away from the first lateral contact surface so as to form an adjustable installation space between the first holder and the first lateral contact surface. The connector is disposed at the adjustable installation space. The connector is fixed by the first lateral contact surface and the first holder, and is removable from the adjustable installation space by sliding the first holder.

According to the quick release module, the fan device and the electronic device as described above, since the first holder is slidably disposed on the support, and the first holder is movable towards or away from the first lateral contact surface, such that the first holder and the first lateral contact surface together form the adjustable installation space for accommodating different sizes of connectors. Therefore, there is no need to produce different molds of different supports according to different sizes of connectors, thereby saving cost and achieving eco-friendly requirements.

In addition, the slidable first holder enables the connector to be easily and quickly removed from or installed on the support in a toolless manner, and thus the removal and installation of the connector is much more efficient.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
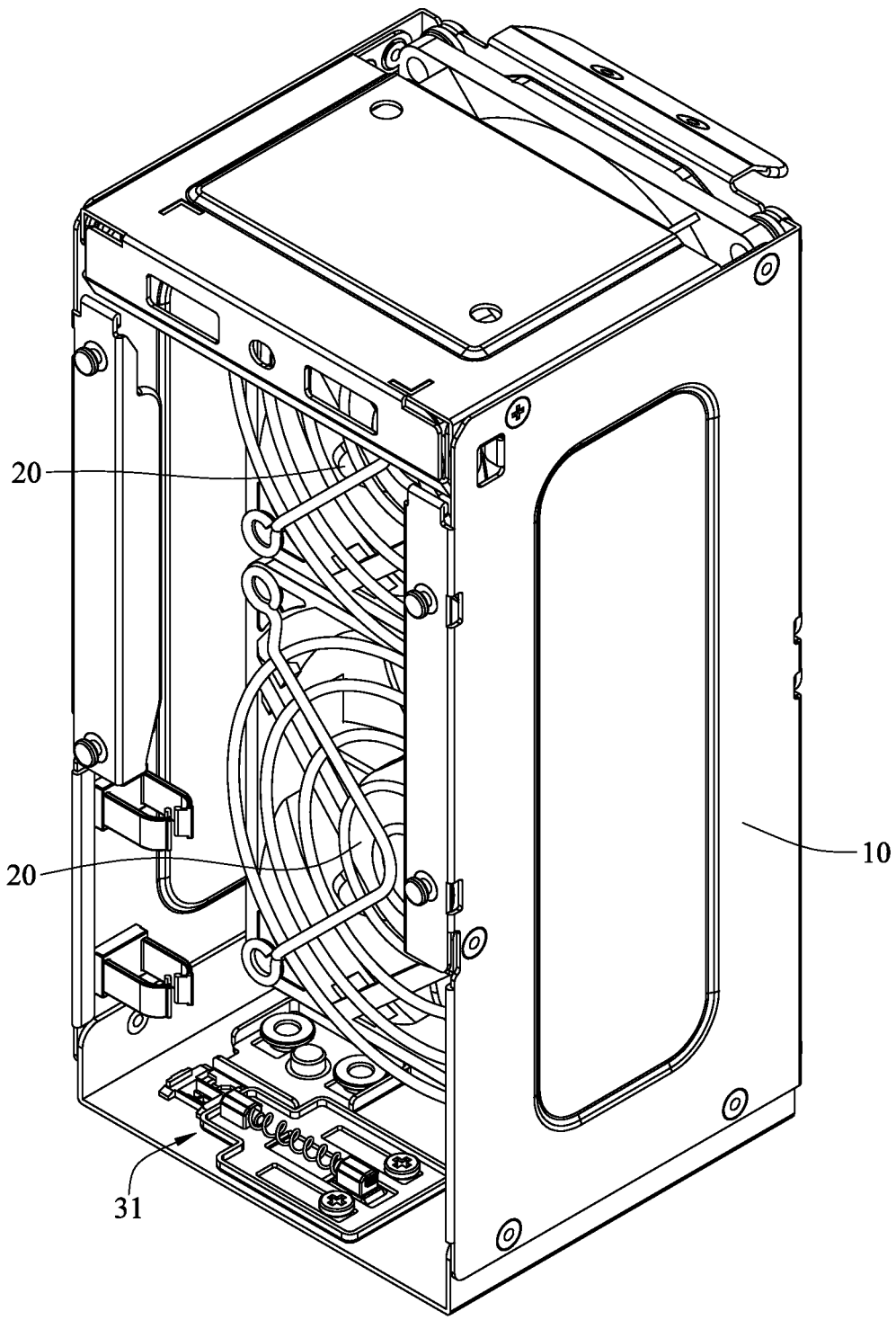
FIG. 1 is a perspective view of a fan device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
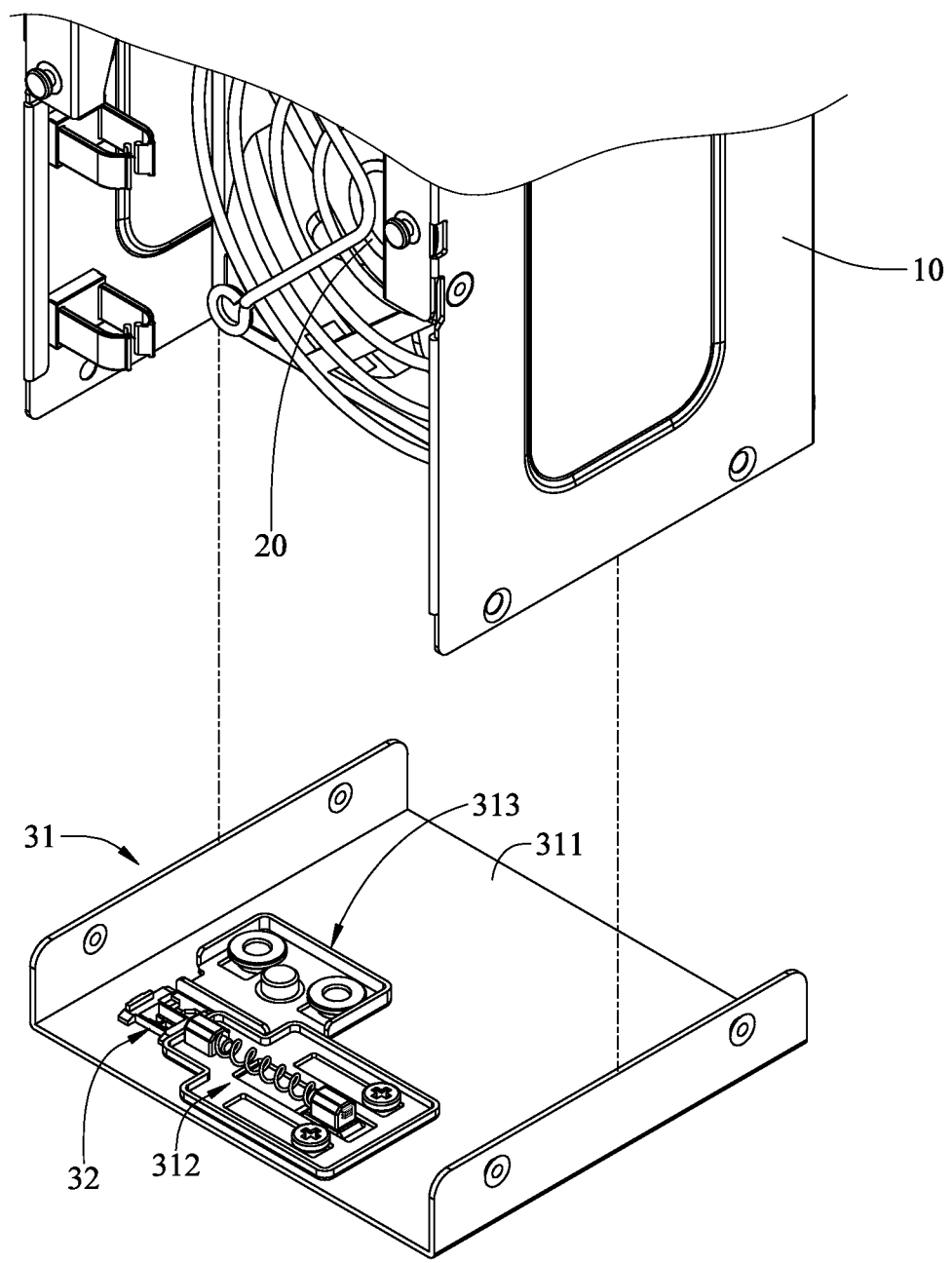
FIG. 2 is a partial exploded view of the fan device in FIG. 1.
Figure 3:
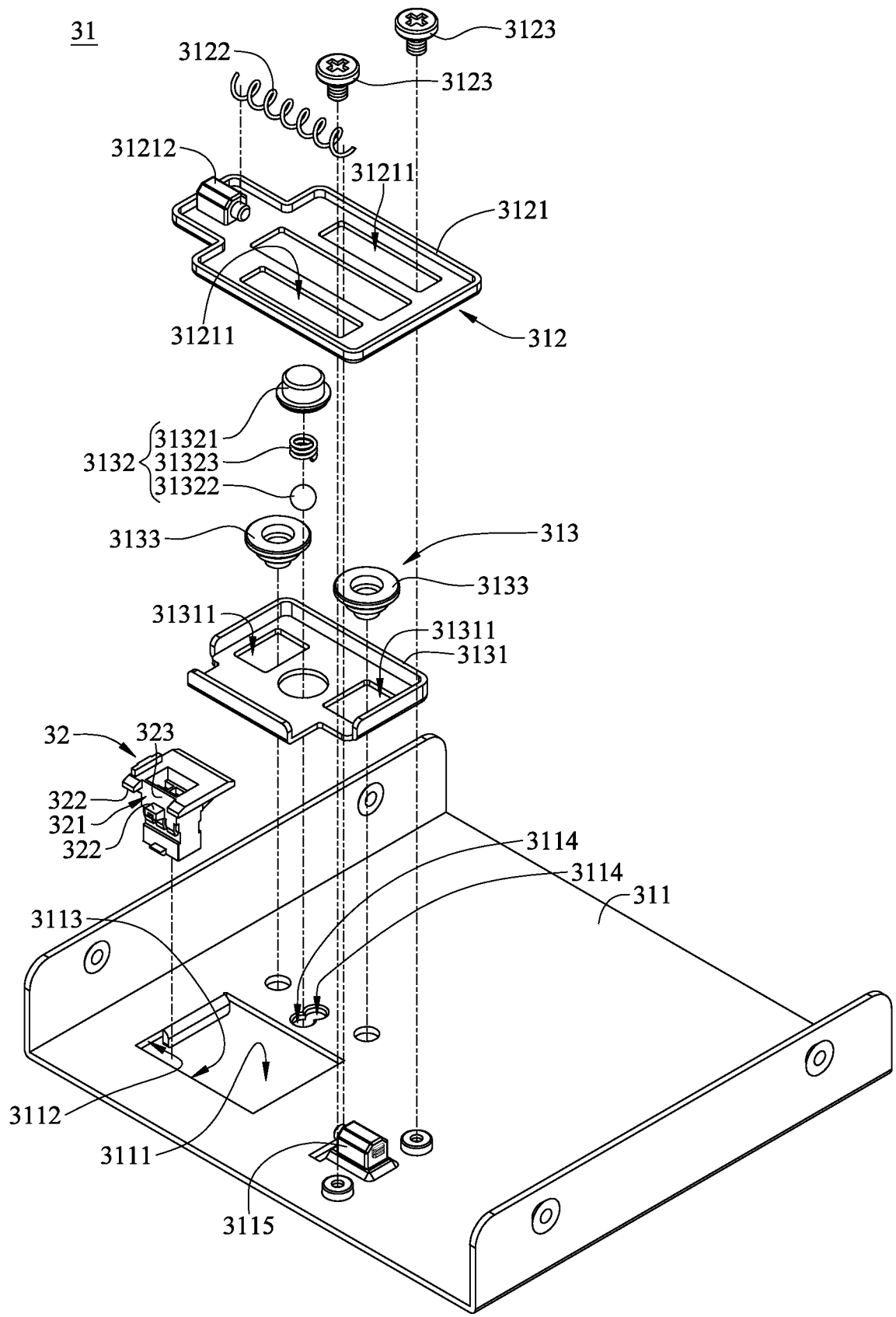
FIG. 3 is an exploded view of a quick release module of the fan device in FIG. 2.
Figure 4:
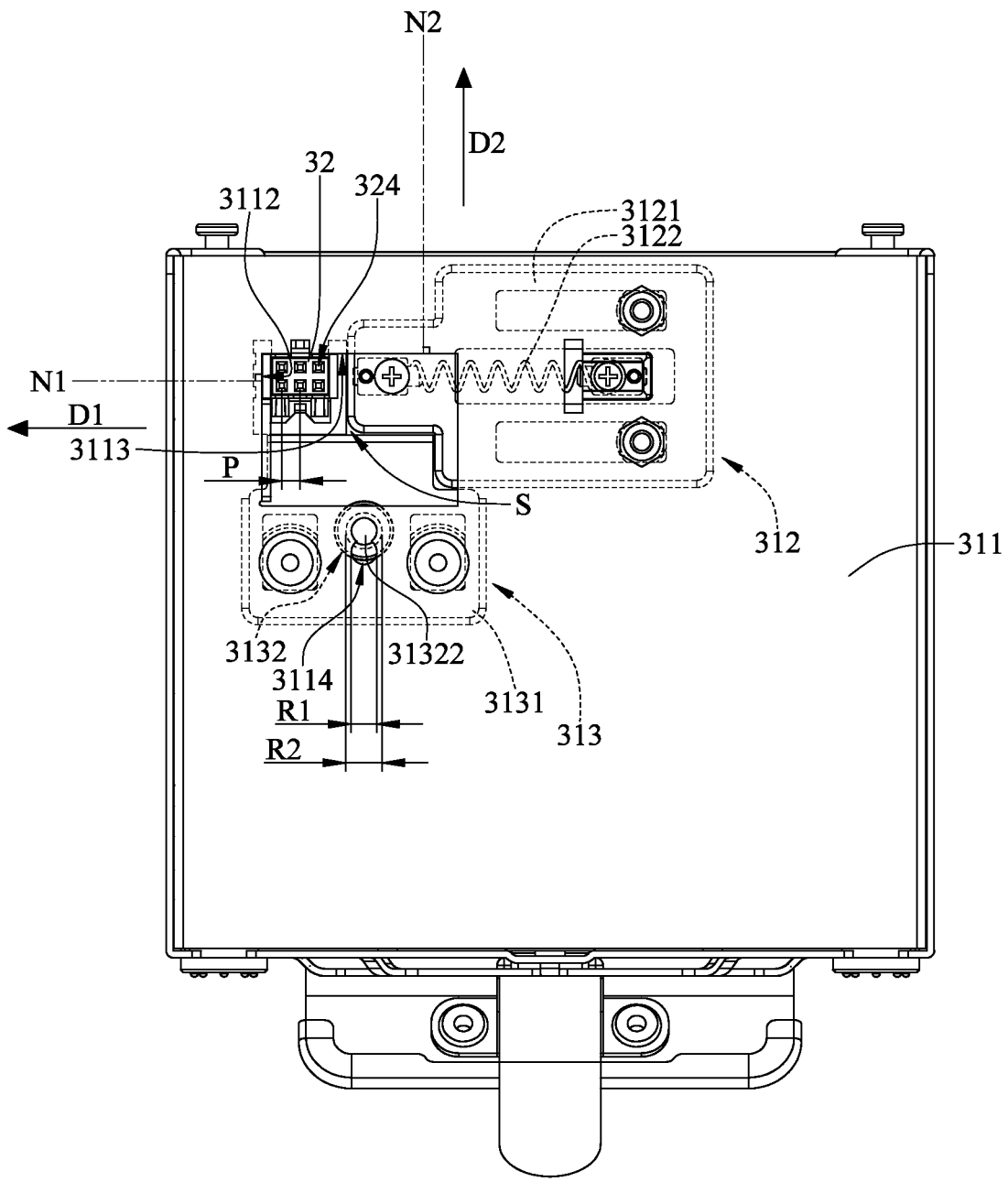
FIG. 4 is a bottom view of the quick release module of the fan device in FIG. 2.

Refer to FIGS. 1 to 4, where FIG. 1 is a perspective view of a fan device 1 according to a first embodiment of the disclosure, FIG. 2 is a partial exploded view of the fan device 1 in FIG. 1, FIG. 3 is an exploded view of a quick release module 31 of the fan device 1 in FIG. 2, and FIG. 4 is a bottom view of the quick release module 31 of the fan device 1 in FIG. 2.

The fan device 1 having a quick release module includes an outer casing 10, two fans 20 and a quick release module 31.

The fans 20 are disposed in the outer casing 10. Note that the quantity of the fans is not restricted in the disclosure and may be modified to be one or larger than two in some other embodiments.

The quick release module 31 includes a support 311, a first release assembly 312 and a connector 32. In addition, the quick release module 31 may further include a second release assembly 313.

The support 311 is fixed to the bottom of the outer casing 10. The support 311 has an accommodation hole 3111, a first lateral contact surface 3112 and a second lateral contact surface 3113. The first lateral contact surface 3112 and the second lateral contact surface 3113 are located at a periphery of the accommodation hole 3111, and the first lateral contact surface 3112 and the second lateral contact surface 3113 respectively face different directions. Specifically, the first lateral contact surface 3112 is perpendicular to the second lateral contact surface 3113; that is, a normal line N1 of the first lateral contact surface 3112 is, for example, perpendicular to a normal line N2 of the second lateral contact surface 3113.

The first release assembly 312 includes a first holder 3121. In addition, the first release assembly 312 may further include two fasteners 3123 and a bias component 3122. The first holder 3121 has two guiding holes 31211 and a protrusion 31212. The fasteners 3123 are, for example, screws. The fasteners 3123 are respectively disposed through the guiding holes 31211 of the first holder 3121 and fixed to the support 311, and the first holder 3121 is slidably disposed on the support 311, where a slidable direction D1 of the first holder 3121 is parallel to the normal line N1 of the first lateral contact surface 3112. The support 311 may have a protrusion 3115. The bias component 3122 is, for example, a compression spring. The elastic modulus of the bias component 3122 falls within a range from 7000 to 8000 kg/mm. Two opposite ends of the bias component 3122 are respectively in contact with the protrusion 31212 of the first holder 3121 and the protrusion 3115 of the support 311. The bias component 3122 is configured to force the first holder 3121 to move towards the first lateral contact surface 3112.

Note that the bias component 3122 is not restricted to being a compression spring. In some other embodiments, the bias component may be an extension spring, and can also force the first holder to move towards the first lateral contact surface by modifying corresponding structures of other components.

The second release assembly 313 includes a second holder 3131. In addition, the second release assembly 313 may further include two fasteners 3133 and a positioning component 3132. The second holder 3131 has two guiding holes 31311. The fasteners 3133 are, for example, rivets. The fasteners 3133 are respectively disposed through the guiding holes 31311 of the second holder 3131 and fixed to the support 311, and the second holder 3131 is slidably disposed on the support 311, where a slidable direction D2 of the second holder 3131 is parallel to the normal line N2 of the second lateral contact surface 3113. The positioning component 3132 includes a shell 31321, a bead 31322 and a bias component 31323. The shell 31321 is disposed on the second holder 3131. The bead 31322 is movably disposed on the shell 31321. The bias component 31323 is, for example, a compression spring. The bias component 31323 is disposed in the shell 31321, and two opposite ends of the bias component 31323 are respectively in contact with the shell 31321 and the bead 31322. The support 311 further has a plurality of positioning holes 3114. The positioning holes 3114 are spaced apart from the second lateral contact surface 3113 by different distances. A diameter R1 of each of the positioning holes 3114 is smaller than a diameter R2 of the bead 31322 by 0.2 mm. The bead 31322 of the positioning component 3132 is positioned at one of the positioning holes 3114, such as the positioning hole 3114 located closer to the second lateral contact surface 3113 among the positioning holes 3114.

In this embodiment, the first holder 3121 and the second holder 3131 are respectively movable towards or away from the first lateral contact surface 3112 and the second lateral contact surface 3113, and the first holder 3121, the second holder 3131, the first lateral contact surface 3112 and the second lateral contact surface 3113 together form an adjustable installation space S.

The connector 32 is, for example, a connector in the Micro-fit series. The connector 32 has a plurality of pins 324, such as six pins 324. The pins 324 are arranged in a 2×3 array, and a pitch P between two of the pins 324 which are adjacent to each other is, for example, 2 mm.

In this embodiment, the connector 32 further has a positioning groove 321 located at one side of the connector 32, and the connector 32 further has two inner side surfaces 322 and an inner bottom surface 323 forming the positioning groove 321. The connector 32 is mounted into the adjustable installation space S, and four sides of the connector 32 are respectively in contact with the first lateral contact surface 3112, the second lateral contact surface 3113, the first holder 3121 and the second holder 3131, and the support 311 is located between the inner side surfaces 322, such that the connector 32 is fixed to the support 311. The connector 32 is electrically connected to the fans 20.

Figure 5:
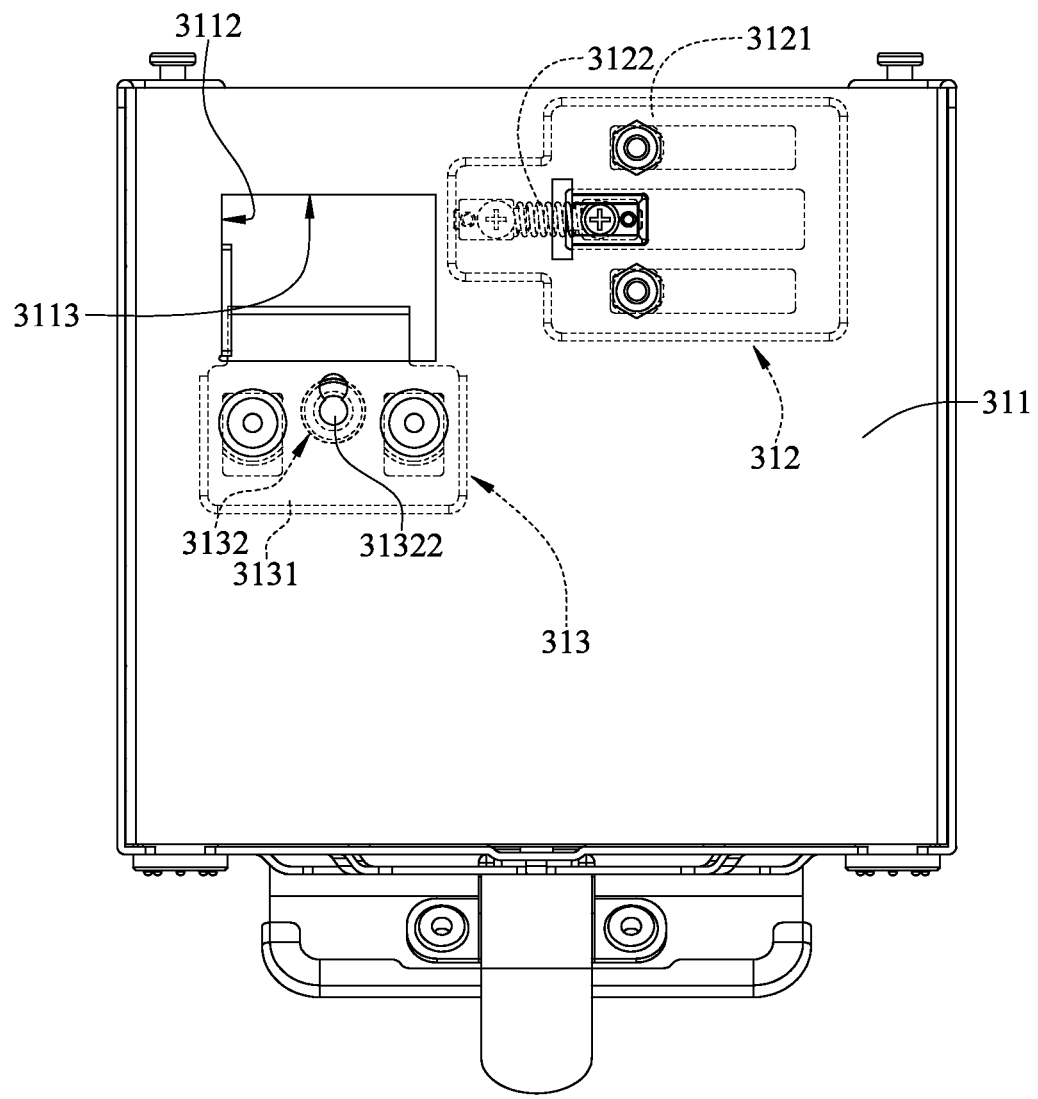
FIG. 5 is a bottom view of the quick release module of the fan device in FIG. 4 when a connector is removed from a support.

Then, refer to FIG. 5, where FIG. 5 is a bottom view of the quick release module 31 of the fan device 1 in FIG. 4 when the connector 32 is removed from the support 311.

During the removal of the connector 32 from the support 311, the second holder 3131 is moved away from the second lateral contact surface 3113 by, for example, a user's finger, such that the bead 31322 of the positioning component 3132 is positioned at the positioning hole 3114 located farther away from the second lateral contact surface 3113. Moreover, the first holder 3121 is moved away from the first lateral contact surface 3112 by the user's finger. By doing so, the adjustable installation space S may be enlarged, such that two sides of the connector 32 are no longer in contact with the first holder 3121 and the second holder 3131, and thus the connector 32 can be removed from the support 311.

On the other hand, during the installation of the connector 32 on the support 311, the bead 31322 of the positioning component 3132 can be firstly positioned at the positioning hole 3114 located farther away from the second lateral contact surface 3113, and the user's finger holds the first holder 3121 to be in a position relatively far away from the first lateral contact surface 3112. After two sides of the connector 32 are respectively in contact with the first lateral contact surface 3112 and the second lateral contact surface 3113, the second holder 3131 is moved towards the second lateral contact surface 3113 to position the bead 31322 of the positioning component 3132 at the positioning hole 3114 located closer to the second lateral contact surface 3113, and the first holder 3121 is released from the user's finger, such that the bias component 3122 forces the first holder 3121 to move towards the first lateral contact surface 3112. As a result, the connector 32 is fixed to the support 311 by the first lateral contact surface 3112, the second lateral contact surface 3113, the first holder 3121 and the second holder 3131.

In this embodiment, the slidable first holder 3121 and the slidable second holder 3131 enable the connector 32 to be easily and quickly removed from or installed on the support 311 in a toolless manner, and thus the removal and installation of the connector 32 is much more efficient.

In addition, the elastic modulus of the bias component 3122 falls within a range from 7000 to 8000 kg/mm, such that it ensures the tactile feedback when the user moves the first holder 3121 by a finger and a sufficient force applied to the first holder 3121 for holding the connector 32. Note that the elastic modulus of the bias component 3122 may be modified as required.

In this embodiment, the adjustable installation space S formed by the first holder 3121, the second holder 3131, the first lateral contact surface 3112 and the second lateral contact surface 3113 can accommodate different sizes of the connectors, and it will be introduced in the following paragraphs.

Figure 6:
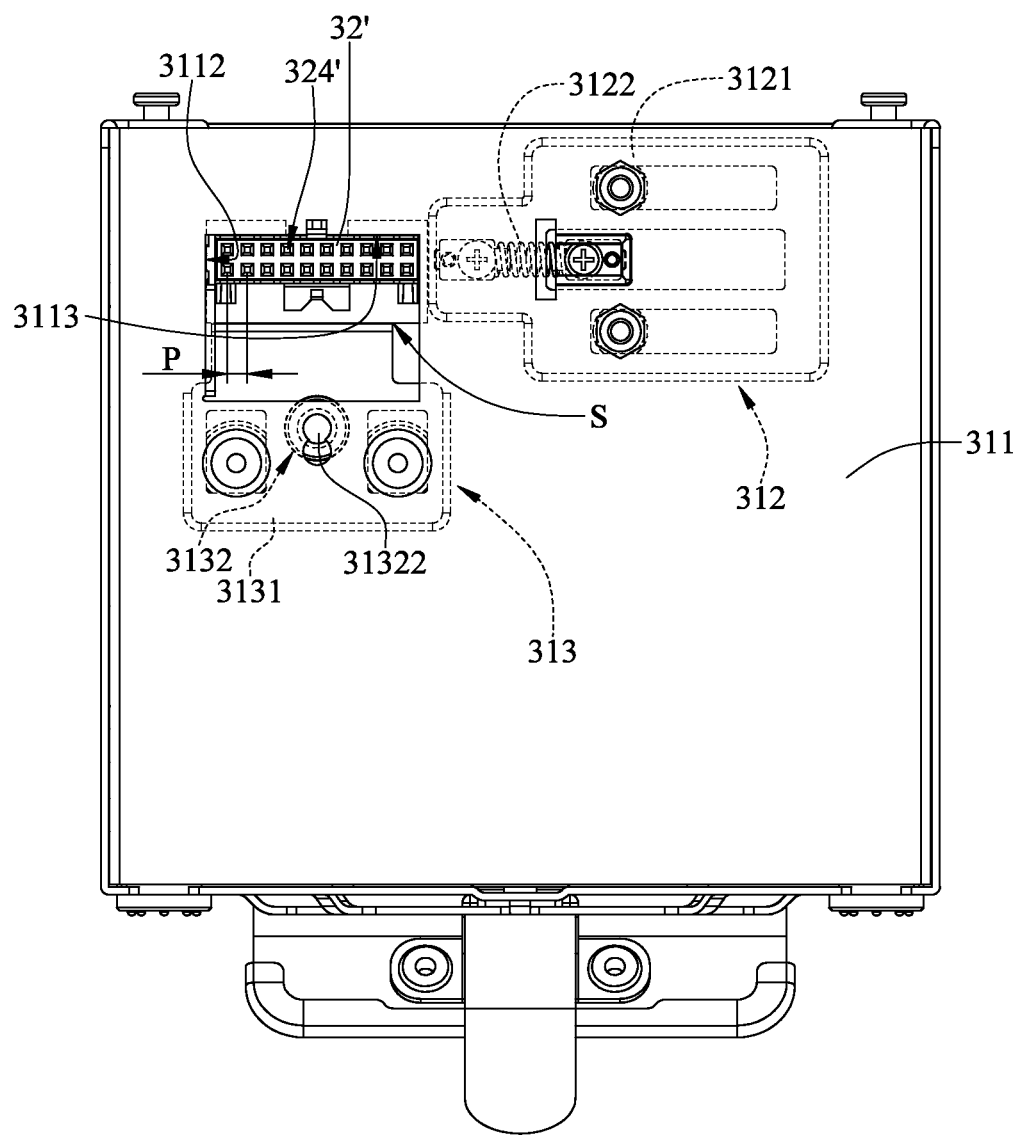
FIGS. 6 and 7 are bottom views of the quick release module of the fan device in FIG. 2 when connectors with different sizes are supported by the support.
Figure 7:
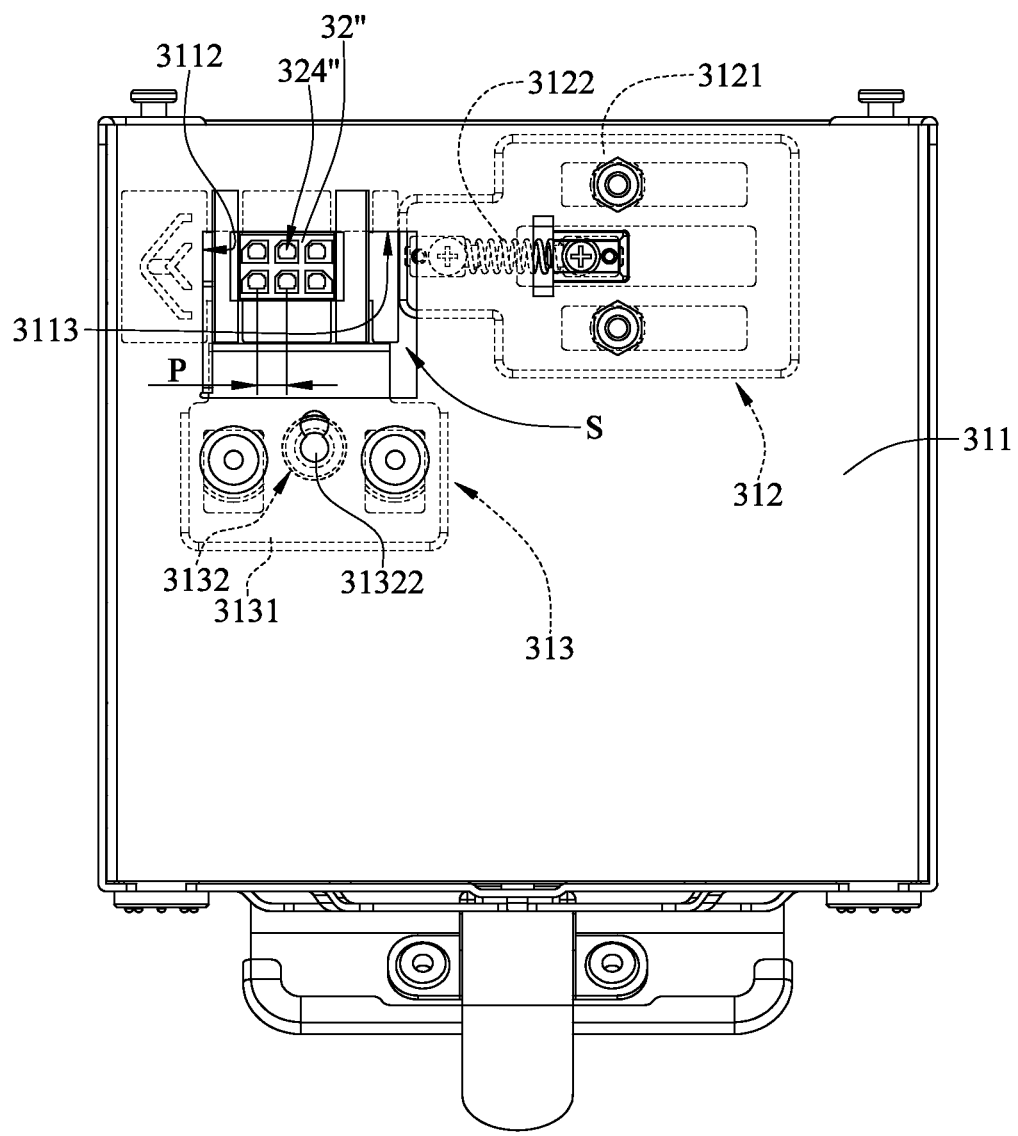

Refer to FIGS. 6 and 7, where FIGS. 6 and 7 are bottom views of the quick release module 31 of the fan device 1 in FIG. 2 when connectors 32' and 32" with different sizes are supported by the support 311.

As shown in FIGS. 6 and 7, the quick release module 31 supports different sizes of the connectors 32' and 32". The connector 32' and 32" are, for example, connectors in the Micro-fit series. The connector 32', for example, has twenty pins 324', the pins 324' are arranged in a 2×10 array, and a pitch P between two of the pins 324' which are adjacent to each other is, for example, 2 mm. In addition, the connector 32", for example, has six pins 324", the pins 324" are arranged in a 2×3 array, and a pitch P between two of the pins 324" which are adjacent to each other is, for example, 3 mm.

As shown in FIG. 6, since the pitch P between adjacent two pins 324' of the connector 32' is 2 mm and is the same as that of the connector 32, in the case that the quantity of the pins 324' of the connector 32' is larger than that of the connector 32, the bead 31322 is maintained to be positioned at the positioning hole 3114 located closer to the second lateral contact surface 3113, while the first holder 3121 is located farther away from the first lateral contact surface 3112 than the first holder 3121 shown in FIG. 4.

As shown in FIG. 7, since the pitch P between adjacent two pins 324' of the connector 32' is larger than that of the connector 32, although the quantity of the pins 324" of the connector 32" is the same as that of the connector 32, the bead 31322 of the positioning component 3132 is positioned at the positioning hole 3114 located farther away from the second lateral contact surface 3113, and the first holder 3121 is located farther away from the first lateral contact surface 3112 than the first holder 3121 shown in FIG. 4.

In this embodiment, since the first holder 3121 and the second holder 3131 are slidably disposed on the support 311, and the first holder 3121 and the second holder 3131 are respectively movable towards or away from the first lateral contact surface 3112 and the second lateral contact surface 3113, such that the first holder 3121, the second holder 3131, the first lateral contact surface 3112 and the second lateral contact surface 3113 together form the adjustable installation space S for accommodating different sizes of connectors. Therefore, there is no need to produce different molds of different supports according to different sizes of connectors, thereby saving cost and achieving eco-friendly requirements.

In this embodiment, the cooperation of the first holder 3121 and the bias component 3122 can achieve a flexible position adjustment of the first holder 3121 for dealing with the obvious difference in lengths of the connectors of different sizes. In addition, since the difference in widths of the connectors of different sizes is not obvious, the cooperation of the second holder 3131 and the positioning component 3132 achieves a specific position adjustment of the second holder 3131.

In this embodiment, there are two positioning holes 3114 of the support 311, but the disclosure is not limited thereto; in some other embodiments, the support may have more positioning holes. As a result, the quick release module can support more different sizes of the connectors. Specifically, the connectors may have 8, 12, 14, 16 or 18 pins, and a pitch between two adjacent pins may be 4 mm.

In addition, in this embodiment, the support 311 of the quick release module 31 is a component which is independent from the outer casing 10, but the disclosure is not limited thereto; in some other embodiments, the support of the quick release module may be a part of the outer casing.

Then, the following paragraphs will introduce quick release modules of other embodiments. These quick release modules are similar to the quick release module 31 introduced with reference to FIGS. 1 to 7, and thus the following paragraphs merely introduce the difference between each quick release module of the following embodiments and the quick release module 31, and the same parts between them will not be repeatedly described. In addition, the quick release module 31 with reference FIGS. 1 to 7 can be replaced with the quick release modules of the following embodiments, and the quick release modules of the following embodiments can also enable different sizes of the connectors to be installed in the adjustable installation space.

Figure 8:
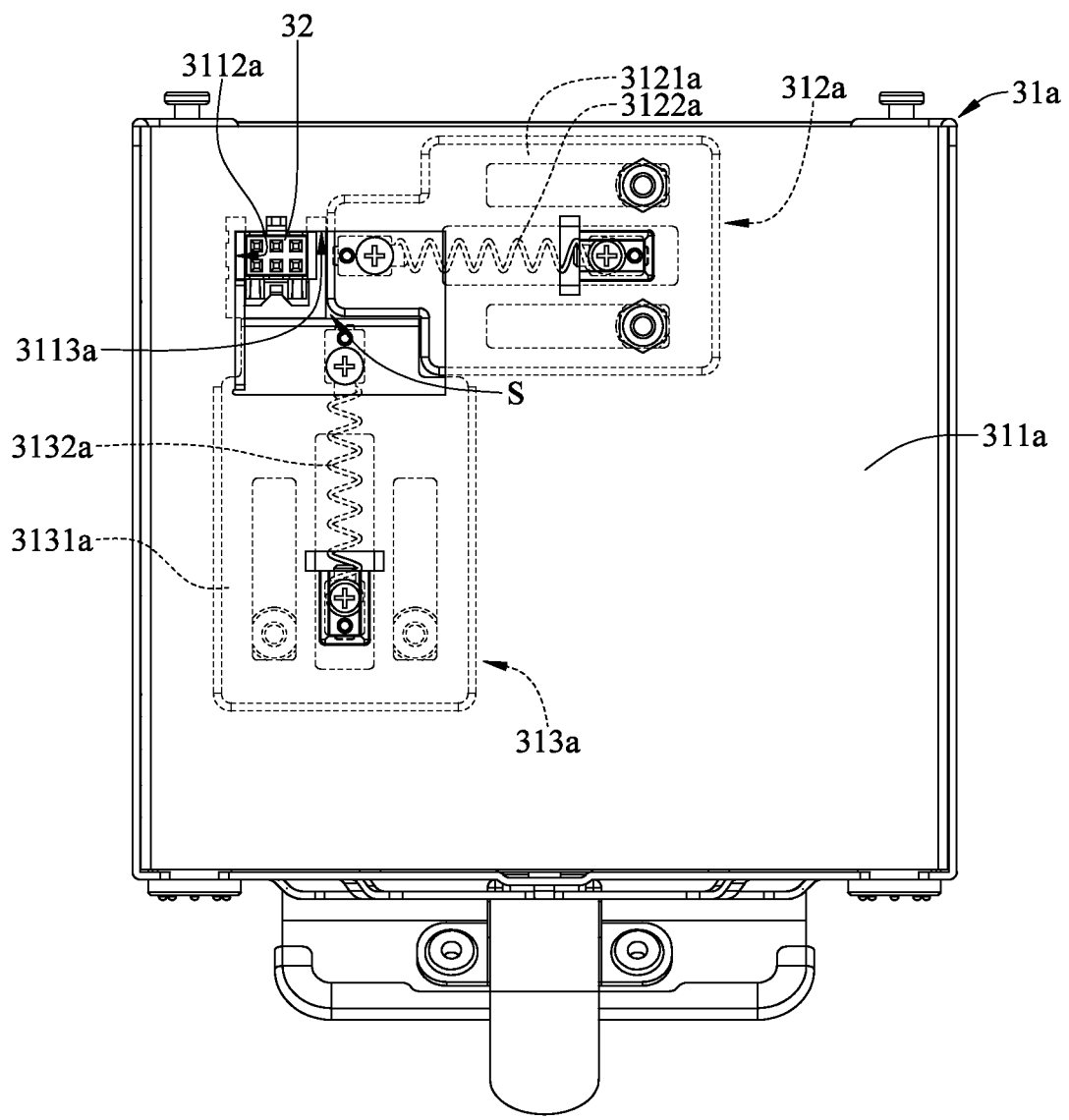
FIG. 8 is a bottom view of a quick release module according to a second embodiment of the disclosure.

Refer to FIG. 8, where FIG. 8 is a bottom view of a quick release module 31a according to a second embodiment of the disclosure.

In the embodiment, a first release assembly 312a of the quick release module 31a includes a first holder 3121a and a bias component 3122a. The first holder 3121a is slidably disposed on a support 311a. The bias component 3122a is, for example, a compression spring. An elastic modulus of the bias component 3122a falls within a range from 7000 to 8000 kg/mm. Two opposite ends of the bias component 3122a are respectively in contact with the first holder 3121a and the support 311a. The bias component 3122a is configured to force the first holder 3121a to move towards a first lateral contact surface 3112a of the support 311a. The second release assembly 313a includes a second holder 3131a and a bias component 3132a. The second holder 3131a is slidably disposed on the support 311a. The bias component 3132a is, for example, a compression spring. An elastic modulus of the bias component 3132a falls within a range from 7000 to 8000 kg/mm. Two opposite ends of the bias component 3132a are respectively in contact with the second holder 3131a and the support 311a. The bias component 3132a is configured to force the second holder 3131a to move towards a second lateral contact surface 3113a of the support 311.

In this embodiment, the first holder 3121a and the second holder 3131a are respectively movable towards or away from the first lateral contact surface 3112a and the second lateral contact surface 3113a, such that the first holder 3121a, the second holder 3131a, the first lateral contact surface 3112a and the second lateral contact surface 3113a together form an adjustable installation space S for the installation of the connector 32.

Note that the bias components 3122a and 3132a are not restricted to being the compression springs. In some other embodiments, the bias components may be extension springs, and can also respectively force the first holder and the second holder to move towards the first lateral contact surface and the second lateral contact surface by modifying corresponding structures of other components.

Figure 9:
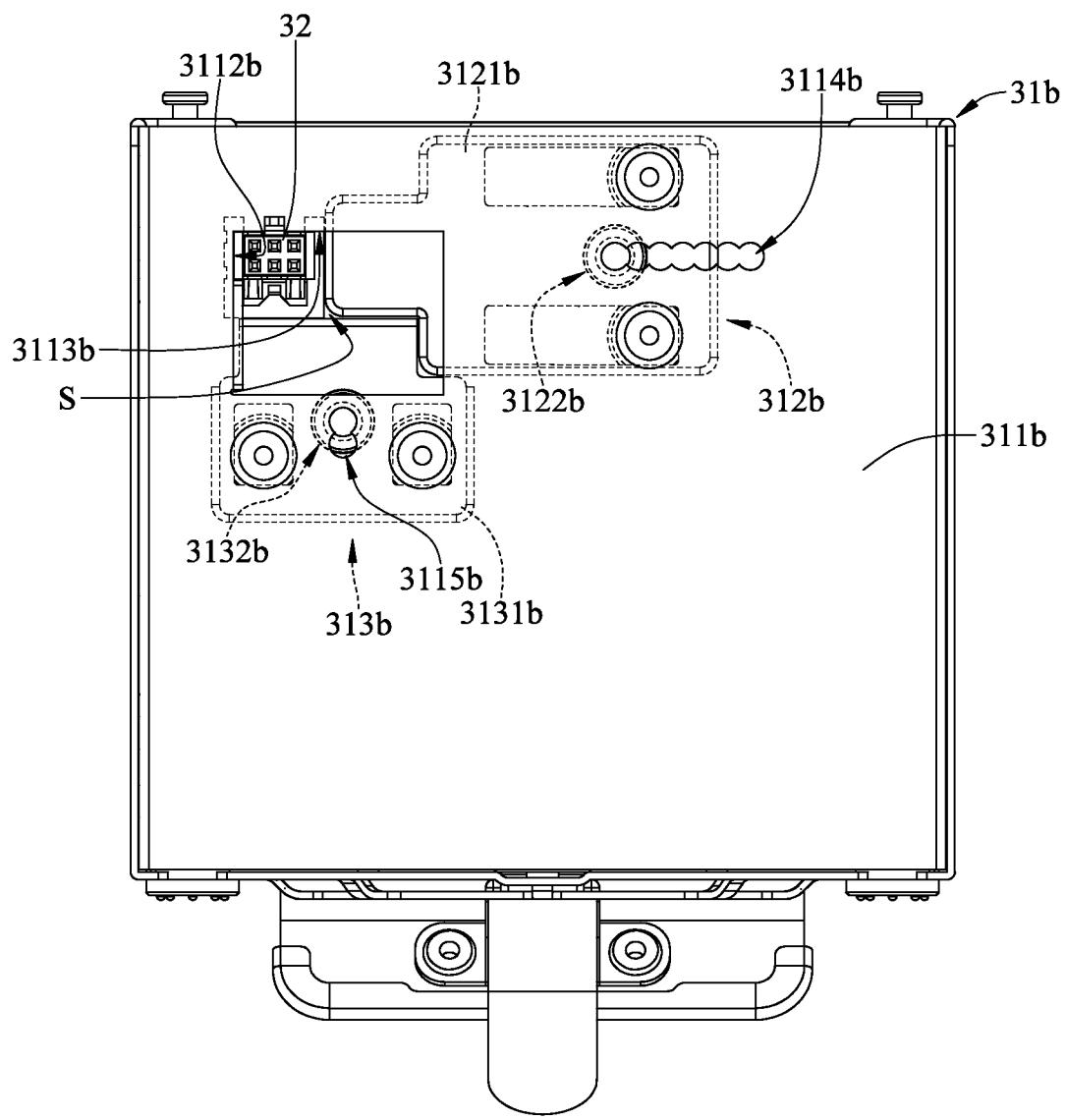
FIG. 9 is a bottom view of a quick release module according to a third embodiment of the disclosure.

Refer to FIG. 9, where FIG. 9 is a bottom view of a quick release module 31b according to a third embodiment of the disclosure.

In this embodiment, a first release assembly 312b of the quick release module 31b includes a first holder 3121b and a positioning component 3122b. The first holder 3121b is slidably disposed on a support 311b. The positioning component 3122b is disposed on the first holder 3121b. The support 311b further has a plurality of first positioning holes 3114b. The first positioning hole 3114b are spaced apart from a first lateral contact surface 3112b of the support 311b by different distances. The positioning component 3122b is positioned at one of the first positioning holes 3114b, such as the first positioning hole 3114b located closest to the first lateral contact surface 3112b among the first positioning holes 3114b. The second release assembly 313b includes a second holder 3131b and a positioning component 3132b. The second holder 3131b is slidably disposed on the support 311b. The positioning component 3132b is disposed on the second holder 3131b. The support 311b further has a plurality of second positioning holes 3115b. The second positioning holes 3115b are spaced apart from a second lateral contact surface 3113b of the support 311b by different distances. The positioning component 3132b is positioned at one of the second positioning holes 3115b, such as the second positioning hole 3115b located closer to the second lateral contact surface 3113b among the second positioning holes 3115b.

In this embodiment, the first holder 3121b and the second holder 3131b are respectively movable towards or away from the first lateral contact surface 3112b and the second lateral contact surface 3113b, such that the first holder 3121b, the second holder 3131b, the first lateral contact surface 3112b and the second lateral contact surface 3113b together form an adjustable installation space S for the installation of the connector 32.

Figure 10:
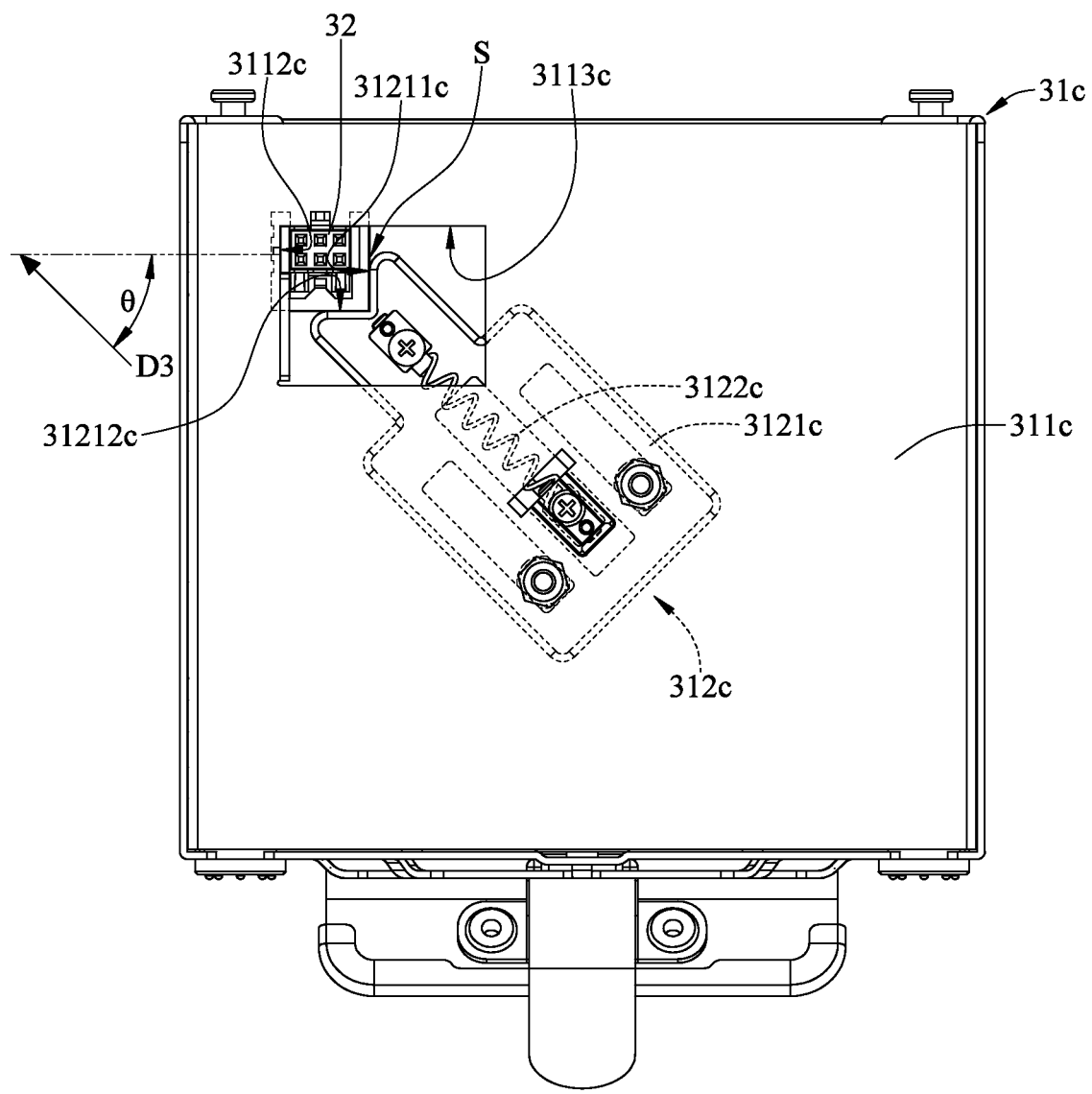
FIG. 10 is a bottom view of a quick release module according to a fourth embodiment of the disclosure.

Refer to FIG. 10, where FIG. 10 is a bottom view of a quick release module 31c according to a fourth embodiment of the disclosure.

In this embodiment, the quick release module 31c does not include the second release assembly. A slidable direction D3 of a first holder 3121c of a first release assembly 312c of the quick release module 31c is at an acute angle θ to a normal line of a first lateral contact surface 3112c of a support 311c. A bias component 3122c of the first release assembly 312c is, for example, a compression spring. An elastic modulus of the bias component 3122c falls within a range from 7000 to 8000 kg/mm. Two opposite ends of the bias component 3122c are respectively in contact with the support 311c and the first holder 3121c. The bias component 3122c is configured to force the first holder 3121c to move towards the first lateral contact surface 3112c.

In this embodiment, the first holder 3121c, for example, has a first contact surface 31211c and a second contact surface 31212c. The first contact surface 31211c and the second contact surface 31212c respectively face the first lateral contact surface 3112c and a second lateral contact surface 3113c of the support 311c. The first contact surface 31211c and the second contact surface 31212c of the first holder 3121c, the first lateral contact surface 3112c and the second lateral contact surface 3113c of the support 311c together form an adjustable installation space S for the installation of the connector 32.

In this embodiment, the first contact surface 31211c and the second contact surface 31212c of the first holder 3121c are respectively in contact with two adjacent sides of the connector 32, but the disclosure is not limited thereto; in some other embodiments, the first holder may not have the first contact surface and the second contact surface, and the first holder may be merely in contact with a corner of the connector formed between two adjacent sides of the connector.

Figure 11:
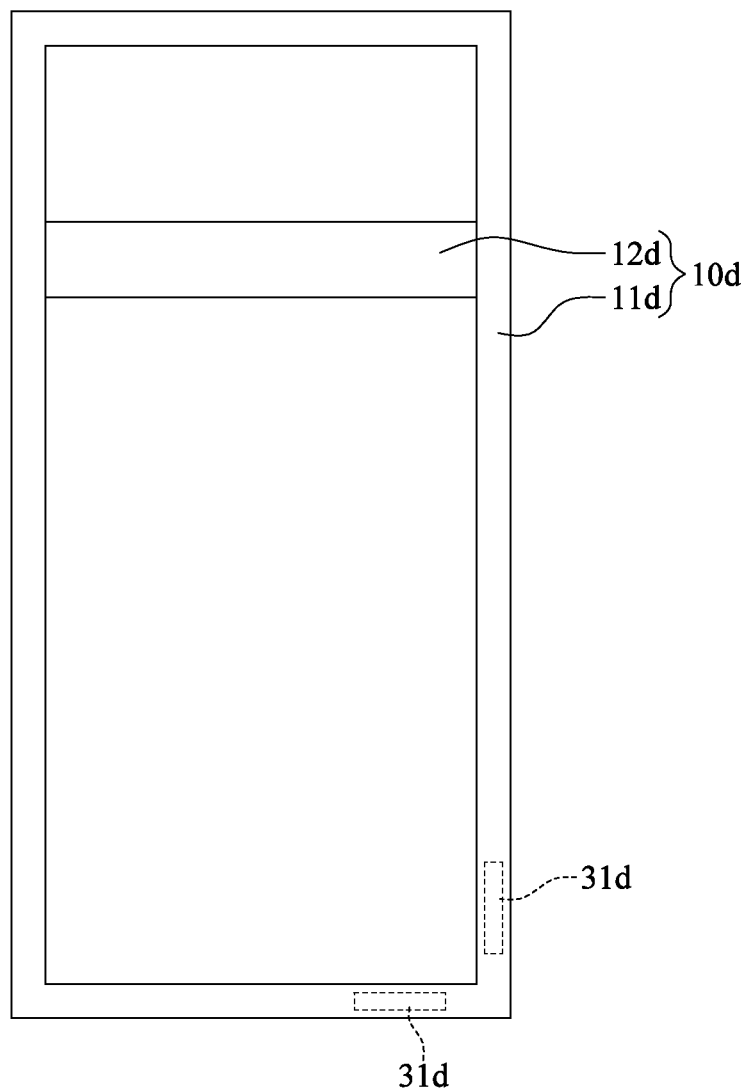
FIG. 11 is a schematic view of an electronic device according to a fifth embodiment of the disclosure.

In the above embodiments, the quick release modules are applied to the fan device, but the disclosure is not limited thereto; in some other embodiments, the quick release module may be applied to other types of devices. For example, refer to FIG. 11, where FIG. 11 is a schematic view of an electronic device 1d according to a fifth embodiment of the disclosure.

In this embodiment, the electronic device 1d having quick release module includes a main body 10d and two quick release modules 31d. The main body 10d, for example, includes a rack 11d and a server 12d located in the rack 11d. The quick release modules 31d may be respectively disposed on different sides of the rack 11d. Specifically, the quick release modules 31d may be respectively disposed on two adjacent sides of the rack 11d, such as the bottom side and the right side, but the disclosure is not limited thereto; in some other embodiments, the quick release modules may be respectively disposed on the bottom side and one of the left side and the rear side of the main body, or the top side and one of the rear side, the left side and the right side of the main body. In another embodiment, the two quick release modules may be respectively disposed on two opposite sides of the main body, such as the top side and the bottom side, or the left side and the right side. In still another embodiment, the two quick release modules may be disposed on the same side of the main body.

The quick release modules 31d are the same as the quick release module 31 with reference of FIGS. 1 to 5, and thus the detail structures of the quick release modules 31d can be referred to the above descriptions of the quick release module 31 with reference of FIGS. 1 to 5 and will not be repeatedly introduced hereinafter.

Figure 12:
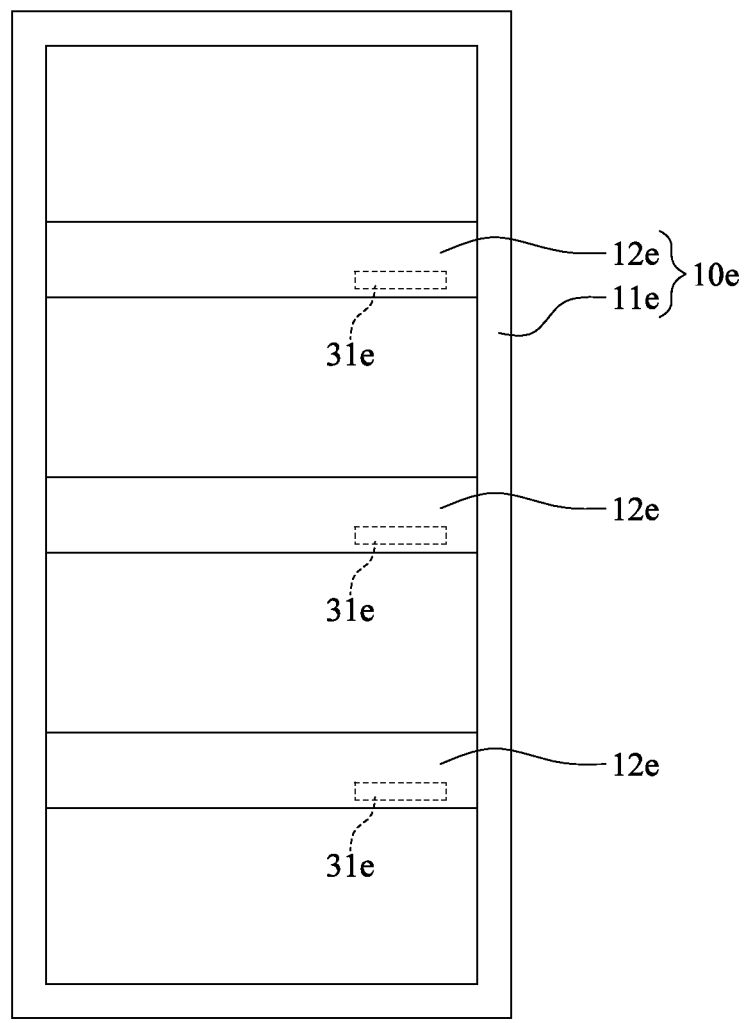
FIG. 12 is a schematic view of an electronic device according to a sixth embodiment of the disclosure.

Then, refer to FIG. 12, where FIG. 12 is a schematic view of an electronic device 1e according to a sixth embodiment of the disclosure.

In this embodiment, the electronic device 1e having quick release module includes a main body 10e and a plurality of quick release modules 31e. The main body 10e, for example, includes a rack 11e and a plurality of servers 12e. The servers 12e are disposed in the rack 11e and sequentially arranged from the top towards the bottom of the rack 11e. The quick release modules 31e are respectively disposed on the server 12e.

The quick release modules 31e are the same as the quick release module 31 with reference of FIGS. 1 to 5, and thus the detail structures of the quick release modules 31e can be referred to the above descriptions of the quick release module 31 with reference of FIGS. 1 to 5 and will not be repeatedly introduced hereinafter.

According to the quick release modules, the fan device and the electronic devices as described above, since the first holder is slidably disposed on the support, and the first holder is movable towards or away from the first lateral contact surface, such that the first holder and the first lateral contact surface together form the adjustable installation space for accommodating different sizes of connectors. Therefore, there is no need to produce different molds of different supports according to different sizes of connectors, thereby saving cost and achieving eco-friendly requirements.

In addition, the slidable first holder enables the connector to be easily and quickly removed from or installed on the support in a toolless manner, and thus the removal and installation of the connector is much more efficient.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A quick release module, comprising:
   a support, having an accommodation hole and a first lateral contact surface located at a periphery of the accommodation hole;
   a first release assembly, comprising a first holder, wherein the first holder is slidably disposed on the support, and the first holder is movable towards or away from the first lateral contact surface so as to form an adjustable installation space between the first holder and the first lateral contact surface; and
   a connector, disposed at the adjustable installation space, wherein the connector is fixed by the first lateral contact surface and the first holder, and is removable from the adjustable installation space by sliding the first holder.

2. The quick release module according to claim 1, further comprising a second release assembly, wherein the support further has a second lateral contact surface located at the periphery of the accommodation hole, the first lateral contact surface and the second lateral contact surface respectively faces different directions, the second release assembly comprises a second holder, the second holder is slidably disposed on the support, the first holder and the second holder are respectively movable towards or away from the first lateral contact surface and the second lateral contact surface, the first holder, the second holder, the first lateral contact surface and the second lateral contact surface together form the adjustable installation space, the adjustable installation space is configured for an installation of the connector, and the connector is fixed by the first lateral contact surface, the second lateral contact surface, the first holder and the second holder.

3. The quick release module according to claim 2, wherein a slidable direction of the first holder is parallel to a normal line of the first lateral contact surface, and a slidable direction of the second holder is parallel to a normal line of the second lateral contact surface.

4. The quick release module according to claim 2, wherein the first release assembly further comprises a bias component, two opposite ends of the bias component are respectively connected to the support and the first holder, the bias component is configured to force the first holder to move towards the first lateral contact surface, the support further has a plurality of positioning holes, the plurality of positioning holes are spaced apart from the second lateral contact surface by different distances, the second release assembly further comprises a positioning component, the positioning component is disposed on the second holder, and the positioning component is positioned at one of the plurality of positioning holes.

5. The quick release module according to claim 4, wherein the bias component is a spring, and an elastic modulus of the bias component falls within a range from 7000 to 8000 kg/mm.

6. The quick release module according to claim 4, wherein the positioning component comprises a shell, a bead and a bias component, the shell is disposed on the second holder, the bead is movably disposed on the shell, the bias component of the positioning component is disposed in the shell, two opposite ends of the bias component of the positioning component respectively press against the shell and the bead, and a diameter of each of the plurality of positioning holes is smaller than a diameter of the bead by 0.2 mm.

7. The quick release module according to claim 2, wherein the first release assembly further comprises a first bias component, two opposite ends of the first bias component are respectively connected to the support and the first holder, the first bias component is configured to force the first holder to move towards the first lateral contact surface, the second release assembly further comprises a second bias component, two opposite ends of the second bias component are respectively connected to the support and the second holder, and the second bias component is configured to force the second holder to move towards the second lateral contact surface.

8. The quick release module according to claim 2, wherein the first release assembly further comprises a first positioning component, the second release assembly further comprises a second positioning component, the support further has a plurality of first positioning holes and a plurality of second positioning holes, the plurality of first positioning holes are spaced apart from the first lateral contact surface by different distances, the plurality of second positioning holes are spaced apart from the second lateral contact surface by different distances, the first positioning component is disposed on the first holder and positioned at one of the plurality of first positioning holes, and the second positioning component is disposed on the second holder and positioned at one of the plurality of second positioning holes.

9. The quick release module according to claim 1, wherein a slidable direction of the first holder is at an acute angle to a normal line of the first lateral contact surface.

10. The quick release module according to claim 9, wherein the first release assembly further comprises a bias component, two opposite ends of the bias component are respectively connected to the support and the first holder, and the bias component is configured to force the first holder to move towards the first lateral contact surface.

11. The quick release module according to claim 2, wherein the connector has a positioning groove, two inner side surfaces and an inner bottom surface, the two inner side surfaces and the inner bottom surface form the positioning groove, the support is located between the two inner side surfaces, and the second lateral contact surface is in contact with the inner bottom surface.

12. The quick release module according to claim 1, wherein the connector has a plurality of pins, and the quantity of the plurality of pins is 6, 8, 12, 14, 16, 18 or 20.

13. The quick release module according to claim 1, wherein the connector has a plurality of pins, a pitch between two of the plurality of pins which are adjacent to each other is 2 mm, 3 mm or 4 mm.

14. The quick release module according to claim 1, wherein the connector has a plurality of pins, the quantity of the plurality of pins is 6, 8, 12, 14, 16, 18 or 20, and a pitch between two of the plurality of pins which are adjacent to each other is 2 mm, 3 mm or 4 mm.

15. A fan device having a quick release module, comprising:
- an outer casing;
- at least one fan, disposed in the outer casing; and
- the quick release module, comprising:
  - a support, fixed to the outer casing and having an accommodation hole and a first lateral contact surface located at a periphery of the accommodation hole;
  - a first release assembly, comprising a first holder, wherein the first holder is slidably disposed on the support, and the first holder is movable towards or away from the first lateral contact surface so as to form an adjustable installation space between the first holder and the first lateral contact surface; and
  - a connector, disposed at the adjustable installation space, wherein the connector is fixed by the first lateral contact surface and the first holder, and is removable from the adjustable installation space by sliding the first holder, and the connector is electrically connected to the at least one fan.

16. The fan device according to claim 15, wherein the quick release module further comprises a second release assembly, the support further has a second lateral contact surface located at the periphery of the accommodation hole, the first lateral contact surface and the second lateral contact surface respectively faces different directions, the second release assembly comprises a second holder, the first holder is slidably disposed on the support, the first holder and the second holder are respectively movable towards or away from the first lateral contact surface and the second lateral contact surface, the first holder, the second holder, the first lateral contact surface and the second lateral contact surface together form the adjustable installation space, and the connector is fixed by the first lateral contact surface, the second lateral contact surface, the first holder and the second holder.

17. The fan device according to claim 16, wherein a slidable direction of the first holder is parallel to a normal line of the first lateral contact surface, and a slidable direction of the second holder is parallel to a normal line of the second lateral contact surface.

18. The fan device according to claim 16, wherein the first release assembly further comprises a bias component, two opposite ends of the bias component are respectively connected to the support and the first holder, the bias component is configured to force the first holder to move towards the first lateral contact surface, the support further has a plurality of positioning holes, the plurality of positioning holes are spaced apart from the second lateral contact surface by different distances, the second release assembly further comprises a positioning component, the positioning component is disposed on the second holder, and the positioning component is positioned at one of the plurality of positioning holes.

19. The fan device according to claim 16, wherein the connector has a positioning groove, two inner side surfaces and an inner bottom surface, the two inner side surfaces and the inner bottom surface form the positioning groove, the support is located between the two inner side surfaces, and the second lateral contact surface is in contact with the inner bottom surface.

20. The fan device according to claim 15, wherein the connector has a plurality of pins, and the quantity of the plurality of pins is 6, 8, 12, 14, 16, 18 or 20.

21. The fan device according to claim 15, wherein the connector has a plurality of pins, a pitch between two of the plurality of pins which are adjacent to each other is 2 mm, 3 mm or 4 mm.

22. The fan device according to claim 15, wherein the connector has a plurality of pins, the quantity of the plurality of pins is 6, 8, 12, 14, 16, 18 or 20, and a pitch between two of the plurality of pins which are adjacent to each other is 2 mm, 3 mm or 4 mm.

23. An electronic device having a plurality of quick release modules, comprising:
- a main body; and
- the plurality of quick release modules, disposed on the main body, wherein each of the plurality of quick release modules comprises:
  - a support, having an accommodation hole and a first lateral contact surface located at a periphery of the accommodation hole;
  - a first release assembly, comprising a first holder, wherein the first holder is slidably disposed on the support, and the first holder is movable towards or away from the first lateral contact surface so as to form an adjustable installation space between the first holder and the first lateral contact surface; and
  - a connector, disposed at the adjustable installation space, wherein the connector is fixed by the first lateral contact surface and the first holder, and is removable from the adjustable installation space by sliding the first holder.

24. The electronic device according to claim 23, wherein the plurality of quick release modules are respectively disposed at different sides of the main body.

25. The electronic device according to claim 23, wherein the main body comprises a rack and a plurality of servers, the plurality of servers are disposed in the rack, and the plurality of quick release modules are respectively disposed on the plurality of servers.

\* \* \* \* \*